(12) United States Patent
Pass et al.

(10) Patent No.: US 9,257,575 B1
(45) Date of Patent: Feb. 9, 2016

(54) FOIL TRIM APPROACHES FOR FOIL-BASED METALLIZATION OF SOLAR CELLS

(71) Applicants: Thomas P. Pass, San Jose, CA (US); Gabriel Harley, Mountain View, CA (US)

(72) Inventors: Thomas P. Pass, San Jose, CA (US); Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/490,552

(22) Filed: Sep. 18, 2014

(51) Int. Cl.
| | |
|---|---|
| *H01L 31/02* | (2006.01) |
| *H01L 21/00* | (2006.01) |
| *H01L 31/0368* | (2006.01) |
| *H01L 31/028* | (2006.01) |
| *H01L 31/0304* | (2006.01) |
| *H01L 31/18* | (2006.01) |

(52) U.S. Cl.
CPC ........ *H01L 31/02021* (2013.01); *H01L 31/028* (2013.01); *H01L 31/0304* (2013.01); *H01L 31/03682* (2013.01); *H01L 31/18* (2013.01)

(58) Field of Classification Search
CPC ............ H01L 31/02021; H01L 31/028; H01L 31/0304; H01L 31/03682; H01L 31/18
See application file for complete search history.

(56) References Cited

U.S. PATENT DOCUMENTS

| | | | |
|---|---|---|---|
| 2012/0103408 A1* | 5/2012 | Moslehi | H01L 31/022441 136/256 |
| 2015/0000724 A1* | 1/2015 | Pass | H01L 31/048 136/251 |

OTHER PUBLICATIONS

J. Park et al., "Localized anodization of aluminum for the formation of Aluminum/Alumina patterns", Asian Symposium for Precision Engineering & Nanotechnology, 2009, 4pgs.
D. A. Brevnov et al., "Fabrication of Patterned Arrays with Alternating Regions of Aluminum and Porous Aluminum Oxide", ectrochem, Solid-State Lett. 2005 vol. 8, Issue 1, C4-05, 1 pg.
H. Jha et al., "Micro-patterning in anodic oxide film on aluminium by laser irradiation", Electrochimica Acta 52, 2007, 11 pgs.
Thomas Pass, et al., U.S. Appl. No. 14/229,716 entitled "Foil-Based Metallization of Solar Cells" filed Mar. 28, 2014, 46 pgs.

* cited by examiner

*Primary Examiner* — Michelle Mandala
(74) *Attorney, Agent, or Firm* — Blakely Sokoloff Taylor Zafman LLP

(57) ABSTRACT

Foil trim approaches for the foil-based metallization of solar cells and the resulting solar cells are described. For example, a method involves attaching a metal foil sheet to a metallized surface of an underlying supported wafer to provide a unified pairing of the metal foil sheet and the wafer. Subsequent to attaching the metal foil sheet, a portion of the metal foil sheet is laser scribed from above to form a groove in the metal foil sheet. Subsequent to laser scribing the metal foil sheet, the unified pairing of the metal foil sheet and the wafer is rotated to provide the metal sheet below the wafer. Subsequent to the rotating, the unified pairing of the metal foil sheet and the wafer is placed on a chuck with the metal sheet below the wafer. The metal foil sheet is torn at least along the groove to trim the metal foil sheet.

9 Claims, 16 Drawing Sheets

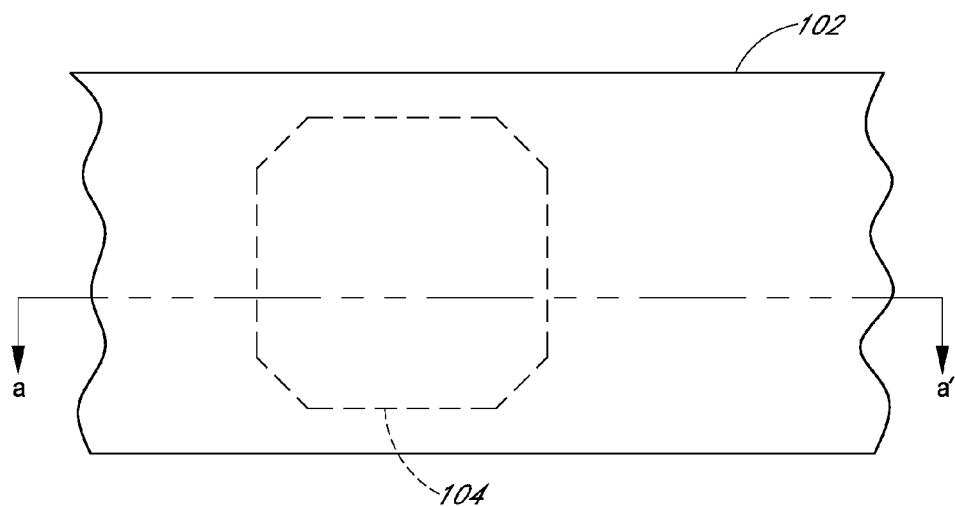
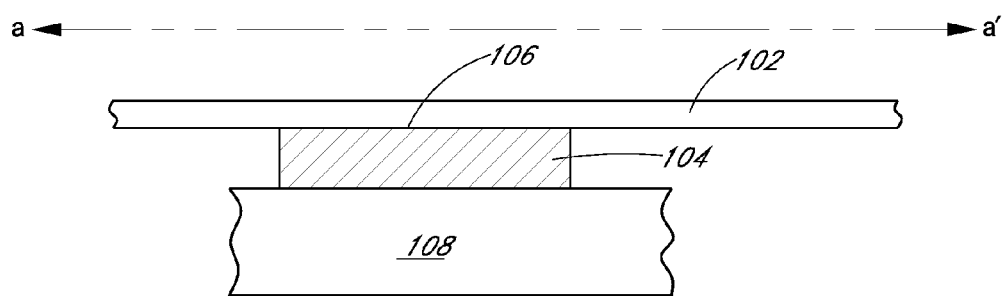
FIG. 1

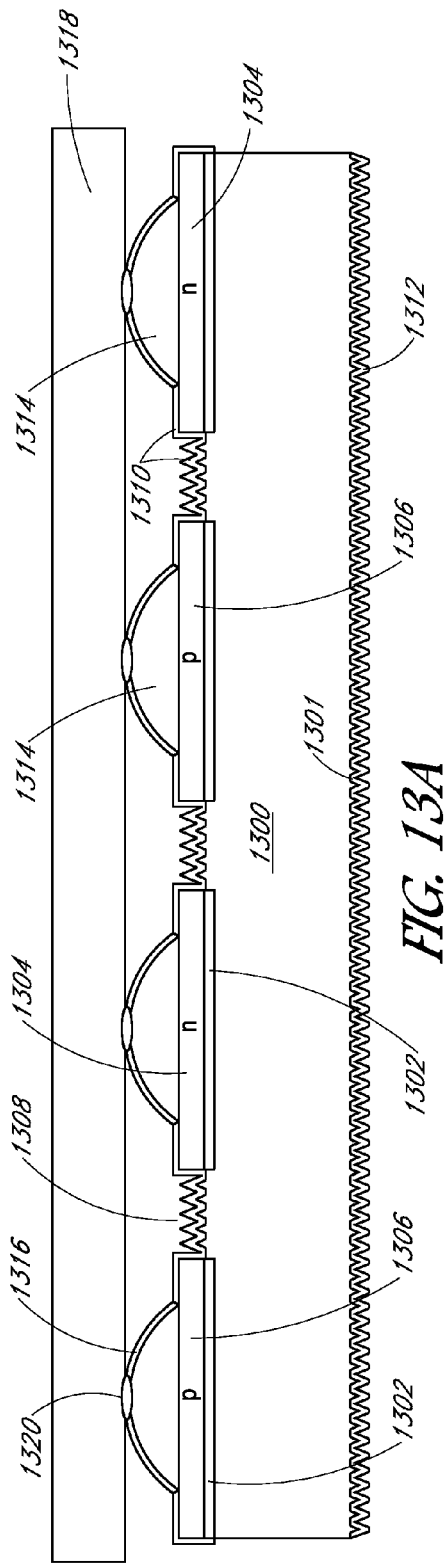
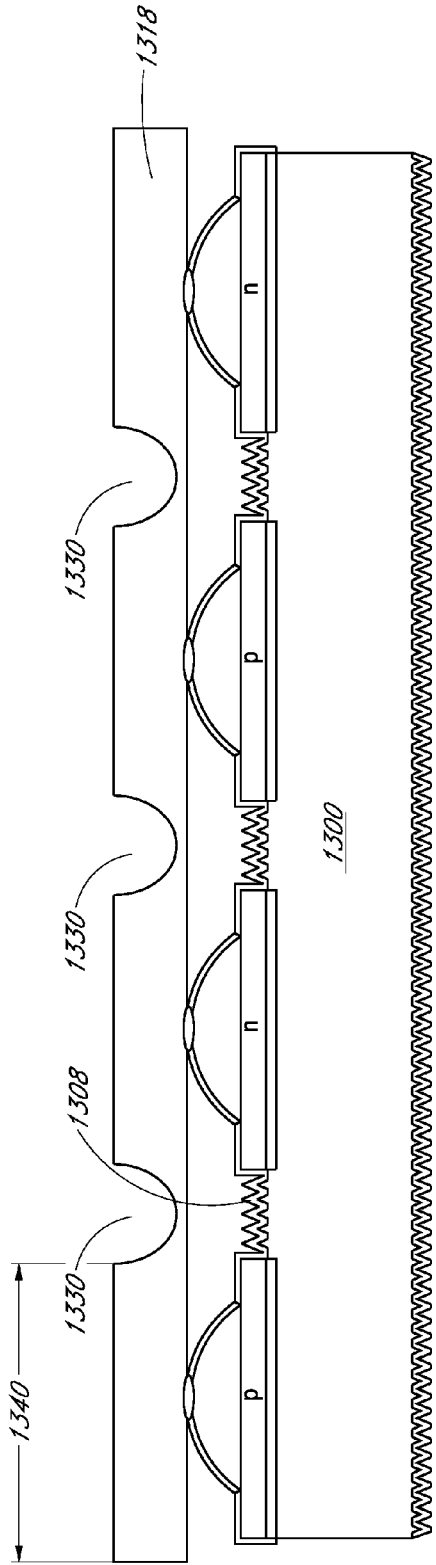

FOIL TRIM APPROACHES FOR FOIL-BASED METALLIZATION OF SOLAR CELLS

TECHNICAL FIELD

Embodiments of the present disclosure are in the field of renewable energy and, in particular, include foil trim approaches for foil-based metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1, 2A-2E and 3-6 illustrate plan and cross-sectional views of various stages in the fabrication of a solar cell using foil-based metallization, in accordance with an embodiment of the present disclosure, wherein:

FIG. 1 illustrates a stage in solar cell fabrication involving attaching a metal foil sheet to a metallized surface of an underlying supported wafer to provide a unified pairing of the metal foil sheet and the wafer;

FIGS. 2A-2E illustrate the pairing of FIG. 1 following laser scribing of a portion of the metal foil sheet from above to form a groove in the metal foil sheet, with various possibilities shown in FIGS. 2A-2E;

FIG. 3 illustrates the pairing of FIGS. 2A-2E following rotating the unified pairing of the metal foil sheet and the wafer to provide the metal sheet below the wafer;

FIG. 4 illustrates the pairing of FIG. 3 following placing of the unified pairing of the metal foil sheet and the wafer on a chuck with the metal sheet below the wafer;

FIG. 5 illustrates the pairing of FIG. 4 following tearing of the metal foil sheet at least along the groove to trim the metal foil sheet and to leave remaining a metal foil piece electrically connected to the metallized surface of the wafer; and FIG. 6 illustrates the pairing of FIG. 5 as removed from the chuck.

FIGS. 13A and 13B illustrate cross-sectional views of various stages in the fabrication of a solar cell using foil-based metallization, in accordance with another embodiment of the present disclosure.

DETAILED DESCRIPTION

Figure 2A:
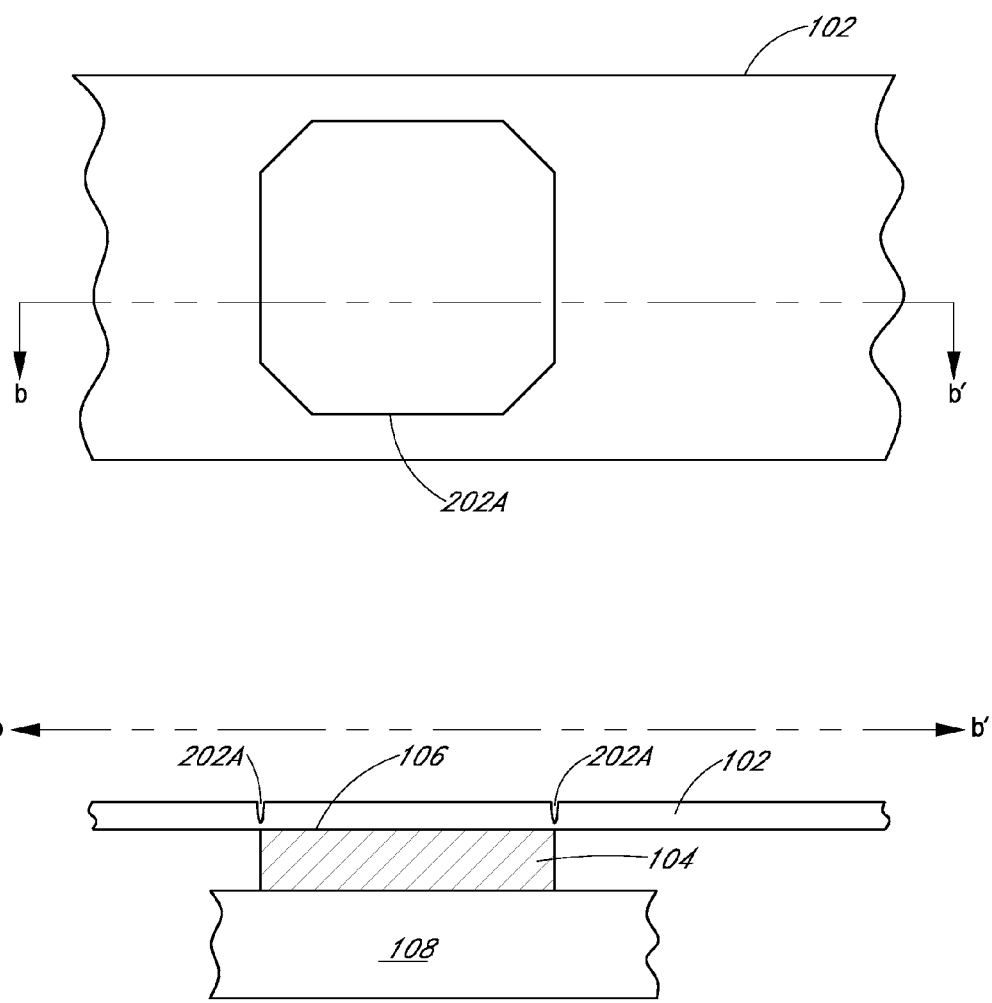

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence;

instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Foil trim approaches for foil-based metallization of solar cells and the resulting solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves attaching a metal foil sheet to a metallized surface of an underlying supported wafer to provide a unified pairing of the metal foil sheet and the wafer. The method also involves, subsequent to attaching the metal foil sheet, laser scribing a portion of the metal foil sheet from above to form a groove in the metal foil sheet. The method also involves, subsequent to laser scribing the metal foil sheet, rotating the unified pairing of the metal foil sheet and the wafer to provide the metal sheet below the wafer. The method also involves, subsequent to the rotating, placing the unified pairing of the metal foil sheet and the wafer on a chuck with the metal sheet below the wafer. The method also involves tearing the metal foil sheet at least along the groove to trim the metal foil sheet.

In another embodiment, a method of fabricating a solar cell involves laser scribing a metal foil sheet attached to a metallized surface of a wafer to form a groove in the metal foil sheet. The method also involves, subsequent to the laser scribing, holding the metal foil sheet or the wafer on a chuck by vacuum suction. The method also involves, while holding the metal foil sheet or the wafer on the chuck, tearing the metal foil sheet at least along the groove to trim the metal foil sheet and to leave remaining a metal foil piece electrically connected to the metallized surface of the wafer.

Also disclosed herein are solar cells. In one embodiment, a solar cell includes a wafer having a metallized surface and having a perimeter. The solar cell also includes a metal foil piece electrically connected to the metallized surface of the wafer. The metal foil piece has a perimeter including a first portion in alignment with or within a first portion of the perimeter of the wafer, and including a second portion overhanging a second portion of the perimeter of the wafer.

One or more embodiments described herein may involve a foil trimming approach for solar cell device metallization fabrication. In an embodiment, to trim a foil attached to a cell (e.g., a foil welded to a solar cell by laser welding), the foil is grooved without fully cutting of the foil. The foil and cell assembly is then flipped or rotated and the foil is vacuum held in place on a chuck while a mechanical tearing of the foil is performed along the groove. In some embodiments, additional partial lasing may be performed subsequent to flipping or rotating to improve tearing of the foil.

To provide context, metal foils are typically purchased in sheet form for lowest cost. In a foil based solar cell metallization process, a wafer may be placed on a chuck, and a foil may then be placed over the wafer. The foil is then fit to the wafer with a mechanical action and welded to the cell. The contact fingers within the foil may then be patterned by cutting, either with a groove and etch approach or by fully lasing through the foil to the cell with a sacrificial layer under the laser cut area.

After the above operations, the excess foil must be trimmed off from the solar cell/foil pairing. In order to perform in a same operation as the above finger patterning process, either a groove and etch approach or sacrificial layer approach is needed to be compatible with the foil trim operation. However, in both cases, the foil is typically cut inside the perimeter of the cell along at least some edges. When trimming the foil inside the perimeter of the cell and cutting fully through the foil, the laser substantially heats the edge of the wafer where cracking is most likely to be induced. To reduce the impact of such heating on the cell, an underlying sacrificial layer can be used. However, such a layer must be very close to the wafer edge and the resulting manufacturing process generally involves an additional operation such as edge coating to create the sacrificial barrier. In accordance with one or more embodiments of the present disclosure, it is preferable to avoid an edge coating operation. In some embodiments, it is also preferable to avoid groove and etch processing for the foil trim in order to avoid laser damage issues and wet chemical processing of wafers with overhanging foils.

Addressing one or more of the above issues, in accordance with an embodiment of the present disclosure, a foil trim is performed along the wafer edge by first lasing a trench approximately between 80 and 95% of the way through the foil, but not completely through the foil. The foil and attached wafer are then released from the initial support (which may be a chuck), flipped or rotated, and vacuum attached with the foil side down to a new chuck. The excess foil is then mechanically torn from the wafer. The torn edge may be inside the wafer edges along some edges and overhanging along other edges, e.g., to provide an overhanging interconnect tab. In one embodiment, when the foil groove is not covered by the wafer, a second lasing process may be performed to aid with the separation of the excess foil. Furthermore, in some embodiments, approaches described herein can be implemented to reduce damage to the wafer after a foil attachment process. In one embodiment, a method to reduce damage to the wafer involves use of a "damage buffer" material deposited (e.g., via printing) near the edge of the wafer. A laser is then used to pattern down to the damage buffer in a continuous or non-continuous method, e.g., by ablating 50 to 99.9% of the total perimeter of the foil completely through (as in a perforation method). A tear method may then be applied to remove any residual metal, which may remain deliberately or as otherwise.

Other embodiments described below involve completely cutting through the foil for portions of foil outside the wafer edge perimeter, i.e., for overhanging regions of foil. Such an approach may minimize the sections that must be torn. Yet other embodiments described below involve leaving the wafer on its original chuck and tearing the foil, avoiding an additional handling operation. However, in this case the foil is not held by vacuum so the attachment to the cell may be exposed to additional mechanical stress. As such, in one embodiment, a top platen is pressed onto the assembly to aid in reducing mechanical stresses.

Figure 5:
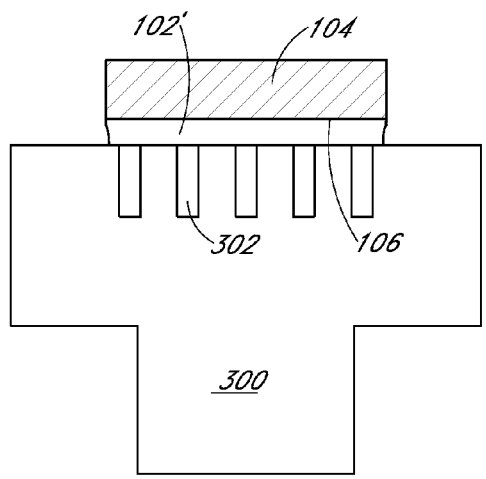
Figure 6:
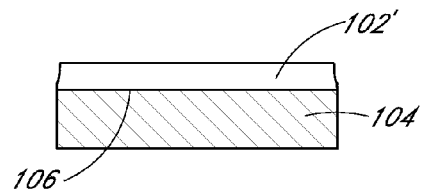
Figure 7:
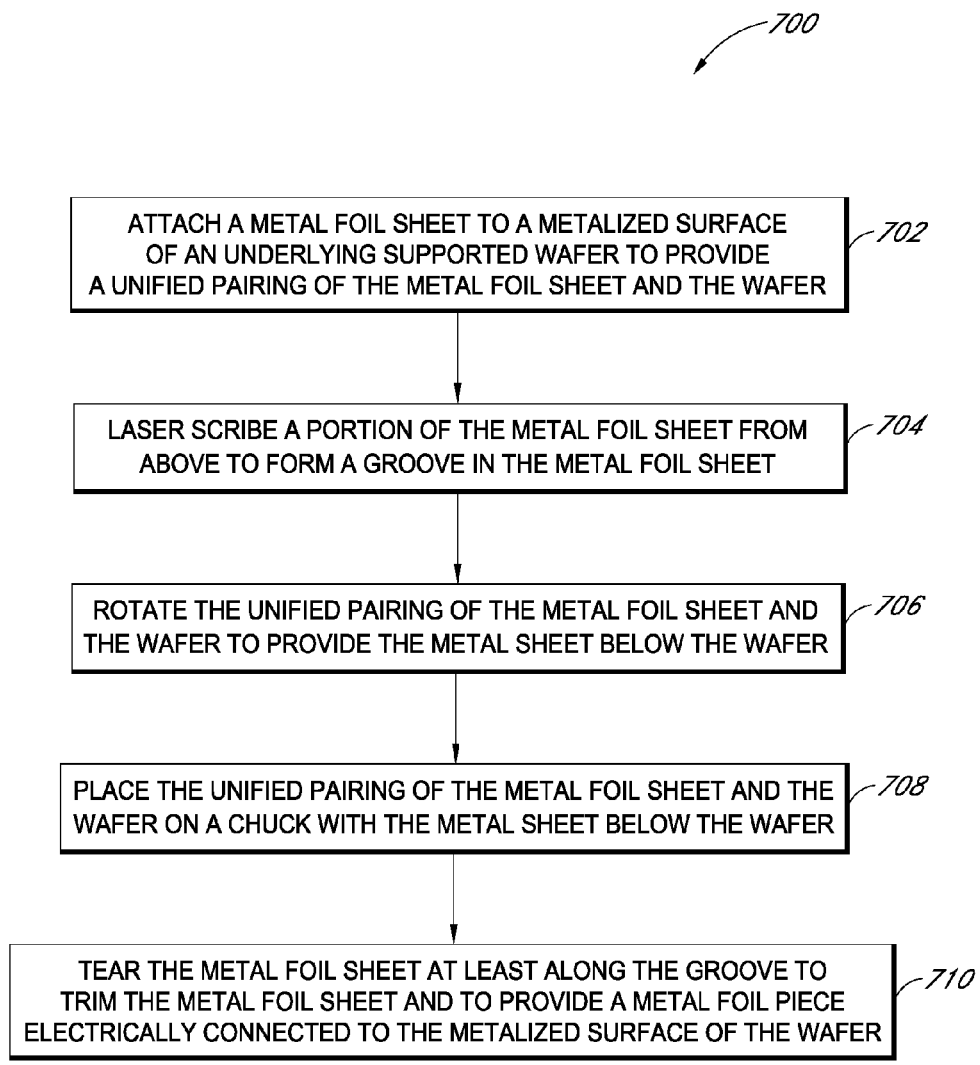
FIG. 7 is a flowchart listing operations in a method of fabricating a solar cell as corresponding to FIGS. 1, 2A-2E and 3-6, in accordance with an embodiment of the present disclosure.

In a first aspect, a foil trim approach is applied with a solar cell and foil pairing oriented foil-side down on a chuck. Consistent with the first aspect, FIGS. 1, 2A-2E and 3-6 illustrate plan and cross-sectional views of various stages in the fabrication of a solar cell using foil-based metallization. FIG. 7 is a flowchart 700 listing operations in a method of fabricating a solar cell as corresponding to FIGS. 1, 2A-2E and 3-6, in accordance with an embodiment of the present disclosure.

Referring to operation 702 of flowchart 700, a method of fabricating a solar cell involves attaching a metal foil sheet to a metallized surface of an underlying supported wafer to provide a unified pairing of the metal foil sheet and the wafer. Referring to corresponding FIG. 1, the upper plan view depicts a metal foil sheet 102 placed over an underlying wafer 104 (shown as dashed lines). The lower cross-sectional view (taken along the a-a' axis of the upper plan view) depicts the metal foil sheet 102 as attached to the metallized surface 106 of the wafer 104. The underlying wafer 104 is supported by a first support 108 which, in one embodiment, may be a first chuck.

In an embodiment, the metal foil sheet 102 is attached to the metallized surface 106 of the wafer 104 by first fitting-up the metal foil sheet with the metallized surface 106 of the wafer. Subsequent to the fitting-up, the metal foil sheet 102 is adhered to the metallized surface 106 of the wafer 104 by laser welding or thermal compression. In one such embodiment, the metallized surface of the wafer 104 includes alternating N-type and P-type semiconductor regions and a plurality of metal seed material regions on each of the alternating N-type and P-type semiconductor regions, as is described in greater detail below in association with FIGS. 13A and 13B. In that embodiment, fitting-up the metal foil sheet 102 involves forming electrical contacts between the metal foil sheet 102 and the plurality of metal seed material regions.

In an embodiment, the metal foil sheet 102 is an aluminum (Al) foil having a thickness approximately in the range of 5-100 microns. In one embodiment, the Al foil is an aluminum alloy foil including aluminum and a second element such as, but not limited to, copper, manganese, silicon, magnesium, zinc, tin, lithium, or combinations thereof. In one embodiment, the Al foil is a temper grade foil such as, but not limited to, F-grade (as fabricated), 0-grade (full soft), H-grade (strain hardened) or T-grade (heat treated). In one embodiment, the aluminum foil is an anodized aluminum foil.

Referring to operation 704 of flowchart 700, subsequent to attaching the metal foil sheet 102, the method involves laser scribing a portion of the metal foil sheet from above to form a groove in the metal foil sheet. Referring to corresponding FIG. 2A (and as referencing FIG. 1), in a first example, the wafer 104 has a perimeter, and the metal foil sheet 102 is laser scribed to form a groove 202A in alignment with the perimeter of the wafer (perimeter shown as dashed line in the plan view FIG. 1, and laser groove shown as solid line in the plan view of FIG. 2A). Thus, referring to the cross-sectional view of FIG. 2A (taken along the b-b' axis), in a first embodiment, the laser scribing provides grooves 202A in alignment with the edges of the wafer 104.

Figure 2B:
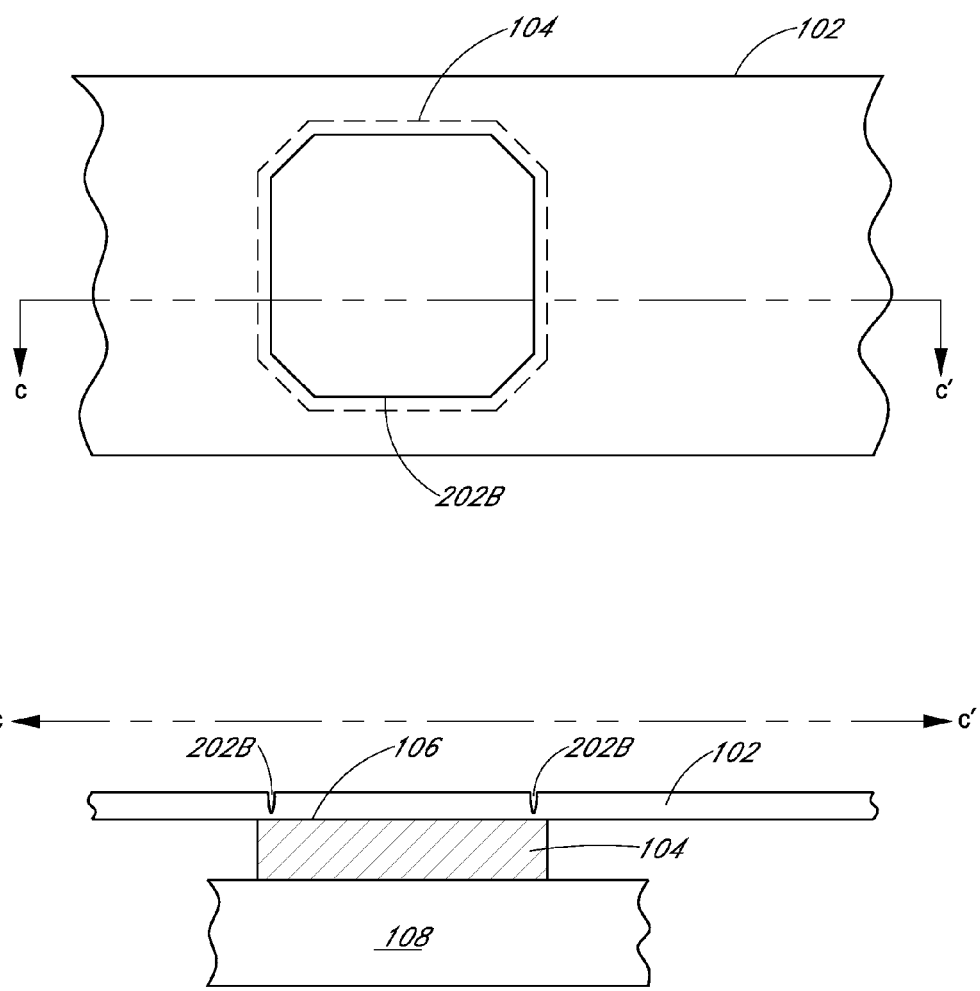

Referring to corresponding FIG. 2B, in a second example, the wafer 104 has a perimeter, and the metal foil sheet 102 is laser scribed to form a groove 202B inside of (i.e., within) the perimeter of the wafer 104 (perimeter shown as dashed line, and laser groove shown as solid line, in the plan view FIG. 2B). Thus, referring to the cross-sectional view of FIG. 2B (taken along the c-c' axis), in a second embodiment, the laser scribing provides grooves 202B within or inside of the edges of the wafer 104.

Figure 2C:
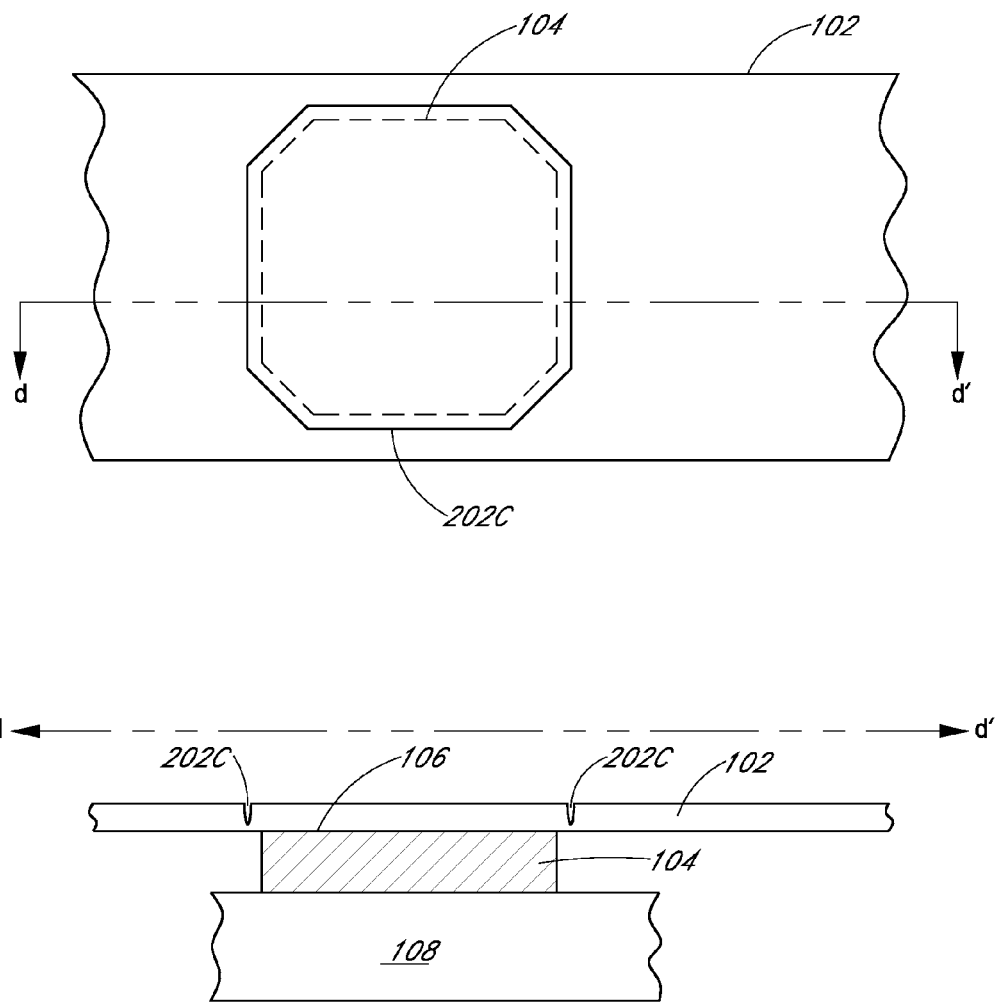

Referring to corresponding FIG. 2C, in a third example, the wafer 104 has a perimeter, and the metal foil sheet 102 is laser scribed to form a groove 202C outside of the perimeter of the wafer 104 (perimeter shown as dashed line, and laser groove shown as solid line, in the plan view FIG. 2C). Thus, referring to the cross-sectional view of FIG. 2C (taken along the d-d' axis), in a third embodiment, the laser scribing provides grooves 202C outside of the edges of the wafer 104.

Figure 2D:
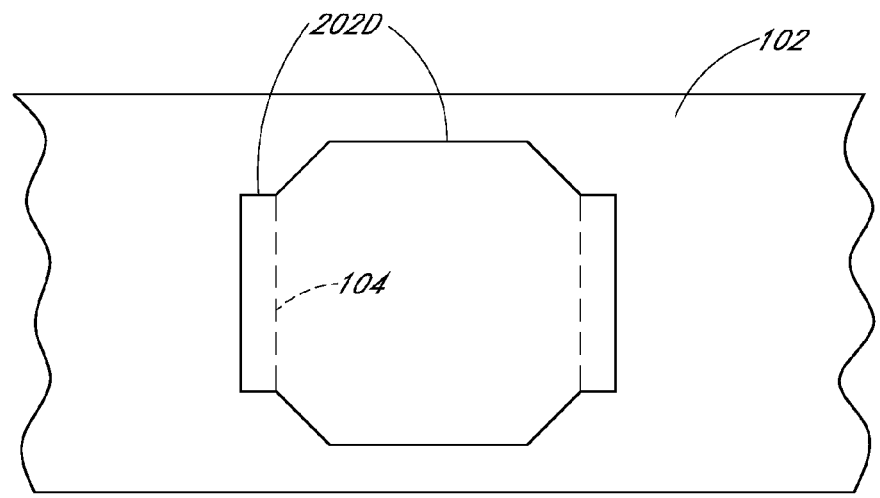

Referring to corresponding FIG. 2D, in a fourth example, the wafer 104 has a perimeter, and the metal foil sheet 102 is laser scribed to form a groove 202D including grooves both outside of the perimeter of the wafer 104 and grooves in alignment with the perimeter of the wafer 104 (portion of perimeter shown as dashed line, and laser groove shown as solid line, in the plan view FIG. 2D). Thus, in a fourth embodiment, the laser scribing provides groove 202D which is made up of grooves outside of some of the edges of the wafer 104 and of grooves in alignment with other of the edges of the wafer 104.

Figure 2E:
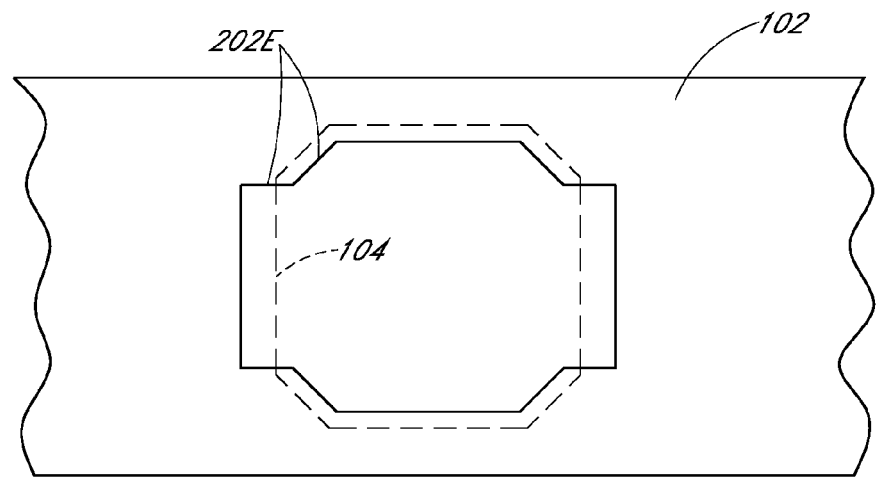

Referring to corresponding FIG. 2E, in a fifth example, the wafer 104 has a perimeter, and the metal foil sheet 102 is laser scribed to form a groove 202E including grooves both outside of the perimeter of the wafer 104 and grooves inside of the perimeter of the wafer 104 (perimeter shown as dashed line, and laser groove shown as solid line, in the plan view FIG. 2E). Thus, in a fifth embodiment, the laser scribing provides groove 202E which is made up of grooves outside of some of the edges of the wafer 104 and of grooves inside of other of the edges of the wafer 104.

In an embodiment, referring collectively to FIGS. 2A-2E, laser scribing the metal foil sheet 102 to form a groove (generally referred to as groove 202) in the metal foil sheet 102 involves forming the groove 202 to a depth approximately in the range of 80-95% of the thickness of the metal foil sheet 102. In an exemplary embodiment, the metal foil sheet 102 has a thickness of approximately 50 microns, and the grooves 202 are formed to a depth of approximately 45 microns to leave approximately 5 microns of thickness of the metal foil sheet 102 remaining. In an embodiment, the laser scribing further involves forming grooves in the metal foil sheet 102 at locations corresponding to regions between metal seed material regions on the surface of the wafer 102, as is described in greater detail below in association with FIGS. 13A and 13B.

Referring to operation 706 of flowchart 700, subsequent to laser scribing the metal foil sheet, the method involves rotating the unified pairing of the metal foil sheet and the wafer to provide the metal sheet below the wafer. Referring to corresponding FIG. 3, the pairing of the metal foil sheet 102 and the wafer 104 is removed from the first support 108 in a first position I. At position I, the metal foil sheet 102 is above the wafer 104. It is noted that the laser grooves formed in the metal foil sheet at the previous processing operation are labeled as 202 in FIG. 3 to represent any one or combination of the groves described in association with FIGS. 2A-2E.

Referring again to FIG. 3, the pairing of the metal foil sheet 102 and the wafer 104 is rotated to a second position II. At position II, the metal foil sheet 102 is below the wafer 104.

Figure 3:
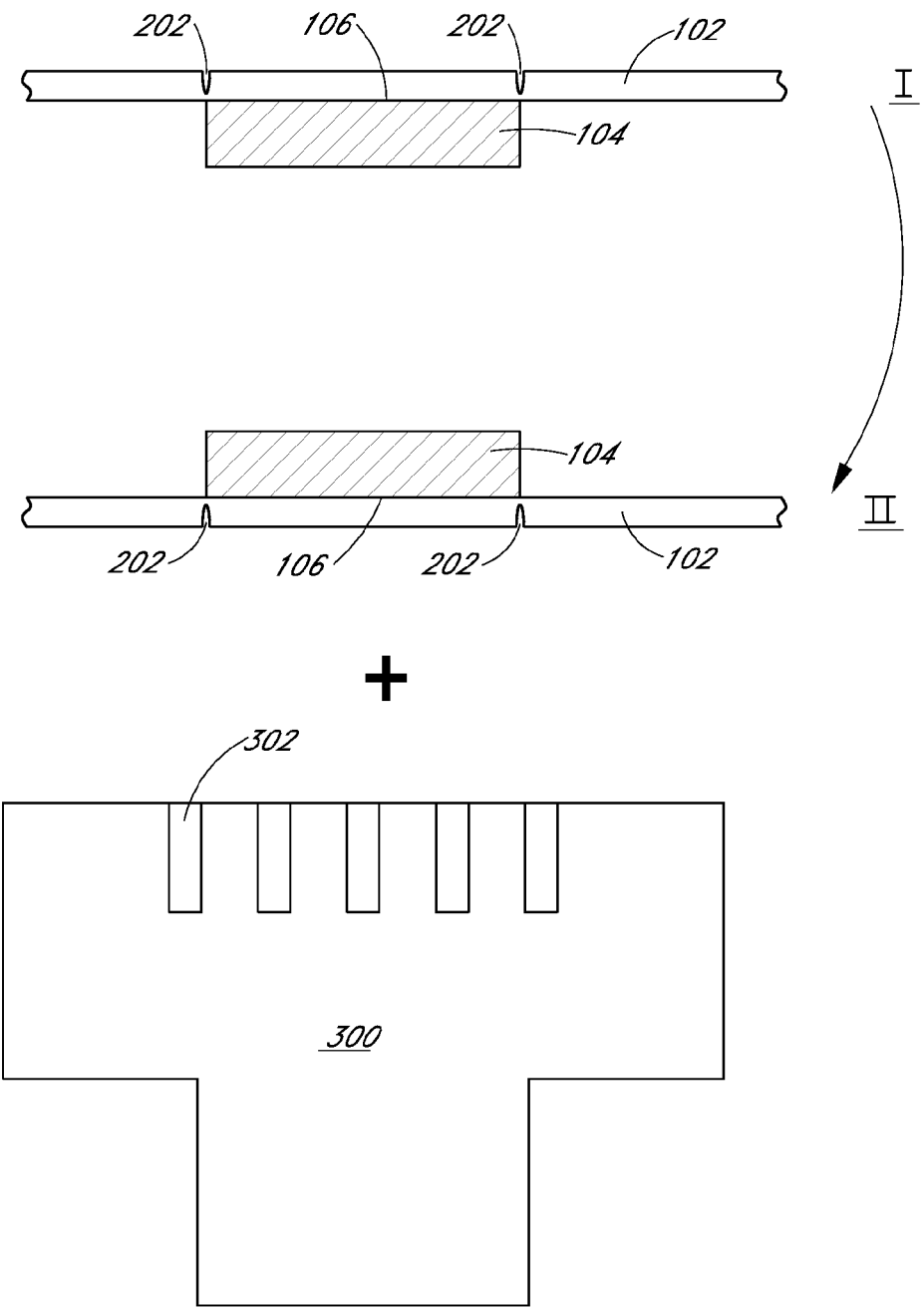
Figure 4:
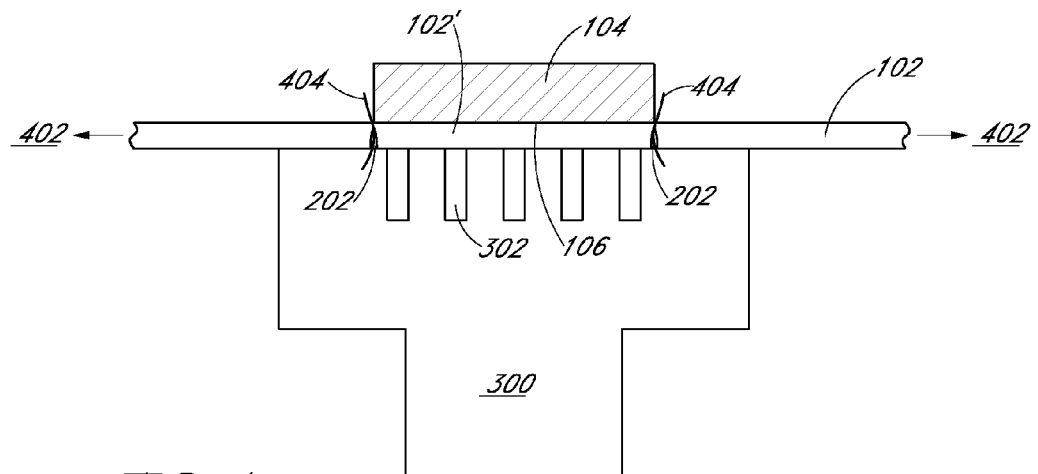

Referring to operation 708 of flowchart 700, subsequent to the rotating, the method involves placing the unified pairing of the metal foil sheet and the wafer on a chuck with the metal sheet below the wafer. Referring to corresponding FIGS. 3 and 4, the pairing of the metal foil sheet 102 and the wafer 104 in the second position II is coupled to a chuck 300. In an embodiment, the pairing of the metal foil sheet 102 and the wafer 104 is held on the chuck 300 by clamping or by vacuum suction. In the latter embodiment, vacuum suction may be achieved using vacuum holes or ports 302 formed in the chuck 300 and opening to the surface of the chuck 300, as is depicted in FIGS. 3 and 4. In an embodiment, the chuck 300 is a different support device than the first support 108 described in association with FIGS. 1 and 2A-2E. However, in other embodiments, the chuck 300 is the same support device as the first support 108.

Referring to operation 710 of flowchart 700, the method involves tearing the metal foil sheet at least along the groove to trim the metal foil sheet and to leave remaining a metal foil piece electrically connected to the metallized surface of the wafer. Referring to corresponding FIGS. 4 and 5, the portions of the metal foil sheet 102 that are outside of the laser grooves 202 are gripped and pulled substantially along directions 402 to tear the metal foil sheet at regions 404 (e.g., in alignment with the laser grooves 202).

Upon tearing and removal of the portions of the metal foil sheet 102 outside of the laser grooves 202, only the portion 102' of the metal foil sheet 102 that is inside of the laser grooves 202 remains. That is, the metal foil sheet 102 is torn at locations 202 to ultimately provide a metal foil piece 102' attached to the metallized surface 106 of the wafer 104, as is depicted in FIG. 5. Referring to FIG. 6, subsequent to tearing the metal foil sheet 102 for trimming, the pairing of the metal foil piece 102' and the wafer 104 is removed from the chuck 300.

In another aspect, a metal foil sheet 102 laser scribed to form grooves that outside of the perimeter of the wafer may be further laser scribed to form complementary grooves to assist with the foil trim process based on tearing. As an example, FIGS. 8A and 8B illustrate cross-sectional views of various stages in the fabrication of a solar cell using foil-based metallization, in accordance with another embodiment of the present disclosure.

Figure 8A:
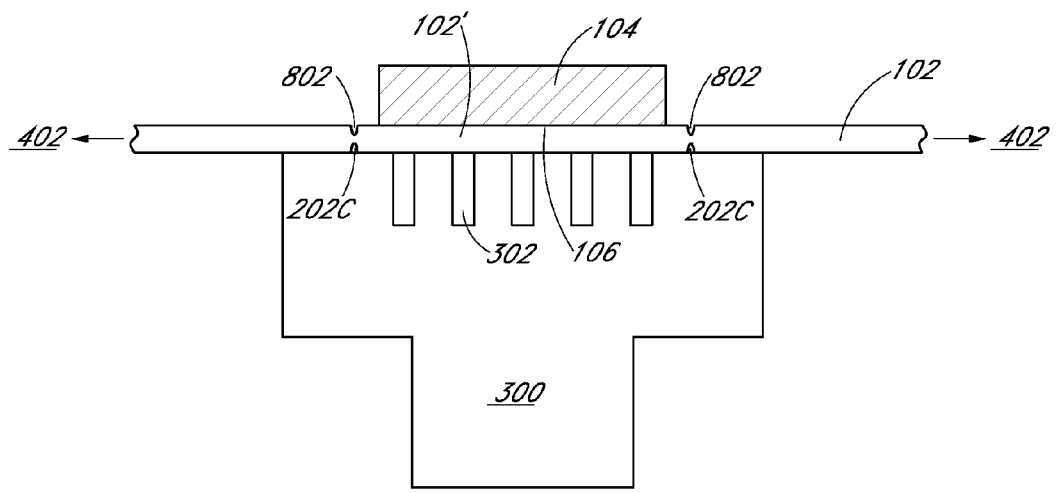
FIGS. 8A and 8B illustrate cross-sectional views of various stages in the fabrication of a solar cell using foil-based metallization, in accordance with another embodiment of the present disclosure.
Figure 8B:
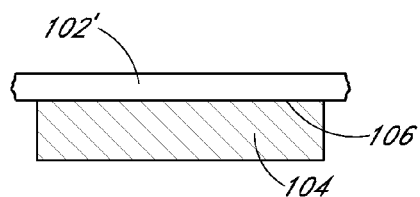

Referring to FIG. 8A, upon rotating the wafer 104 and metal foil sheet 102 pairing in order to provide the metal foil sheet 102 below the wafer 104, additional laser scribing may be performed to form grooves 802. In one such embodiment, the grooves 802 are formed complementary to grooves 202C formed outside of the perimeter of the wafer 104, as is depicted in FIG. 8A. Referring to FIGS. 8A and 8B, the fabrication of such complementary grooves in the metal foil sheet 102 may aid with the tearing/trimming of the metal foil sheet 102. It is to be appreciated that the fabrication of complementary grooves may also be performed for scribe lines having only a portion of the groove outside of the perimeter of the wafer 102, e.g., partial complementary grooving may be performed for scenarios such as those described in association with FIGS. 2D and 2E. In any case, referring to FIG. 8B, solar cell fabrication processing which retains at least a portion of the metal foil sheet 102 as an overhang portion may benefit from complementary groove formation. In yet another embodiment, the same scenarios having at least a portion of the groove outside of the perimeter of the wafer may instead be initially laser scribed entirely through the metal foil sheet to form breaks at those locations during the preliminary laser scribing process.

In a second aspect, a foil trim approach is applied with a solar cell and foil pairing oriented wafer-side down on a chuck. Consistent with the first aspect, FIGS. 9A-9D illustrate cross-sectional views of various stages in the fabrication of a solar cell using foil-based metallization, in accordance with another embodiment of the present disclosure.

Figure 9A:
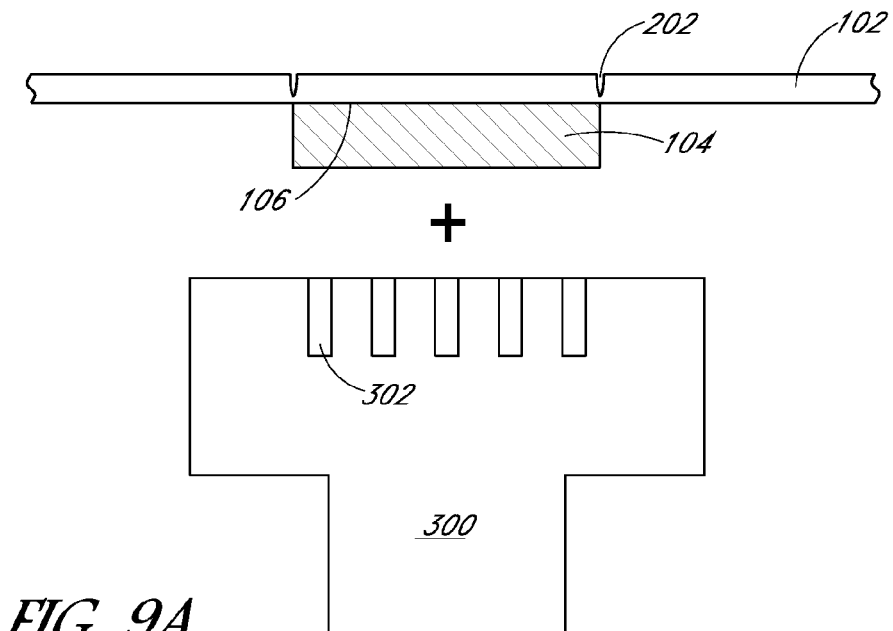
FIGS. 9A-9D illustrate cross-sectional views of various stages in the fabrication of a solar cell using foil-based metallization, in accordance with another embodiment of the present disclosure.
Figure 9B:
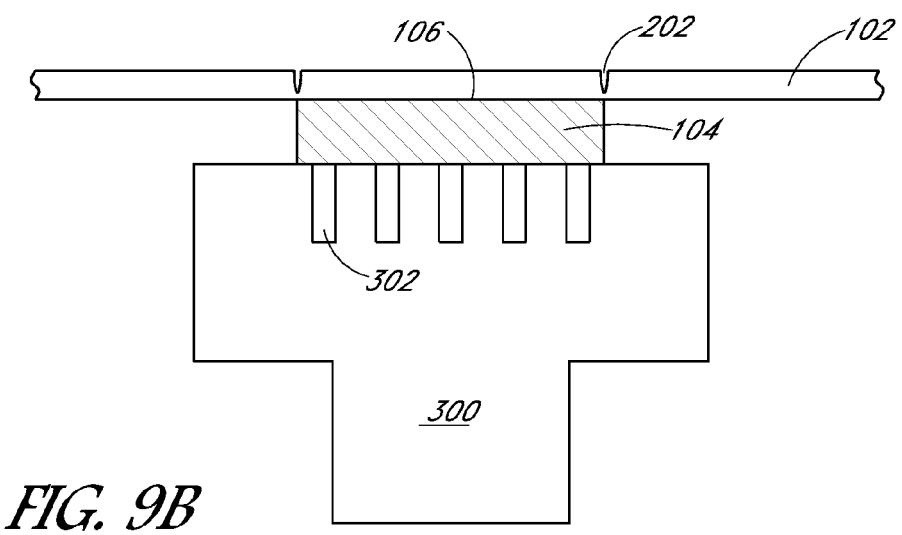
Figure 9C:
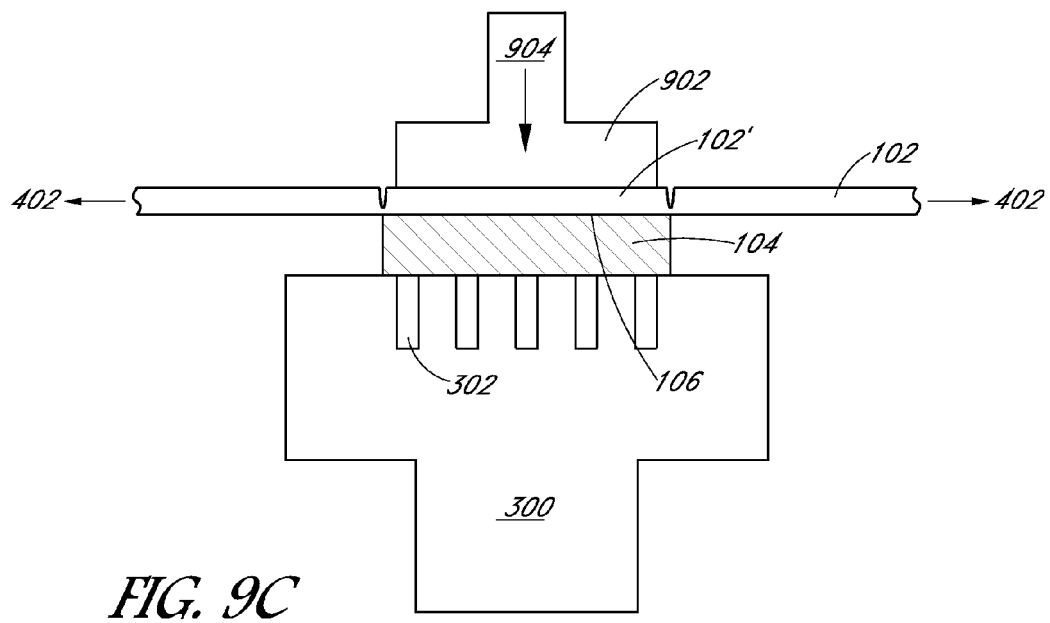
Figure 9D:
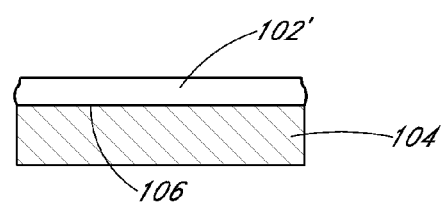

Referring to FIGS. 9A and 9B, a laser grooved 202 metal foil sheet 102 and wafer 104 pairing is placed on a chuck 300 while in position I instead of in position II (referencing the positions described in association with FIG. 3). Referring to FIGS. 9C and 9D, the portions of the metal foil sheet 102 that are outside of the laser grooves 202 are gripped and pulled substantially along directions 402 to tear the metal foil sheet at regions 404 (e.g., in alignment with the laser grooves 202). It is to be appreciated that, although not depicted in FIG. 9B, in the case that vacuum suction is used to hold the pairing to the chuck 300, the metal foil sheet 102 may be pulled to the top surface of the chuck, at least somewhat conformal to the wafer 104.

Upon tearing and removal of the portions of the metal foil sheet 102 outside of the laser grooves 202, only the portion 102' of the metal foil sheet 102 that is inside of the laser grooves 202 remains. That is, the metal foil sheet 102 is torn at locations 202 to ultimately provide a metal foil piece 102' attached to the metallized surface 106 of the wafer 104, as is depicted in FIG. 9D. Also shown in FIG. 9D, subsequent to tearing the metal foil sheet 102 for trimming, the pairing of the metal foil piece 102' and the wafer 104 is removed from the chuck 300.

Referring again to FIG. 9C, in an embodiment, a platen 902 is pressed down in direction 904 onto the metal foil sheet 102. In one such embodiment, the platen 902 is pressed down onto the metal foil sheet 102 to reduce mechanical stress on the metallized surface 106 of the wafer 104 during the tearing of the metal foil sheet 102.

Figure 10:
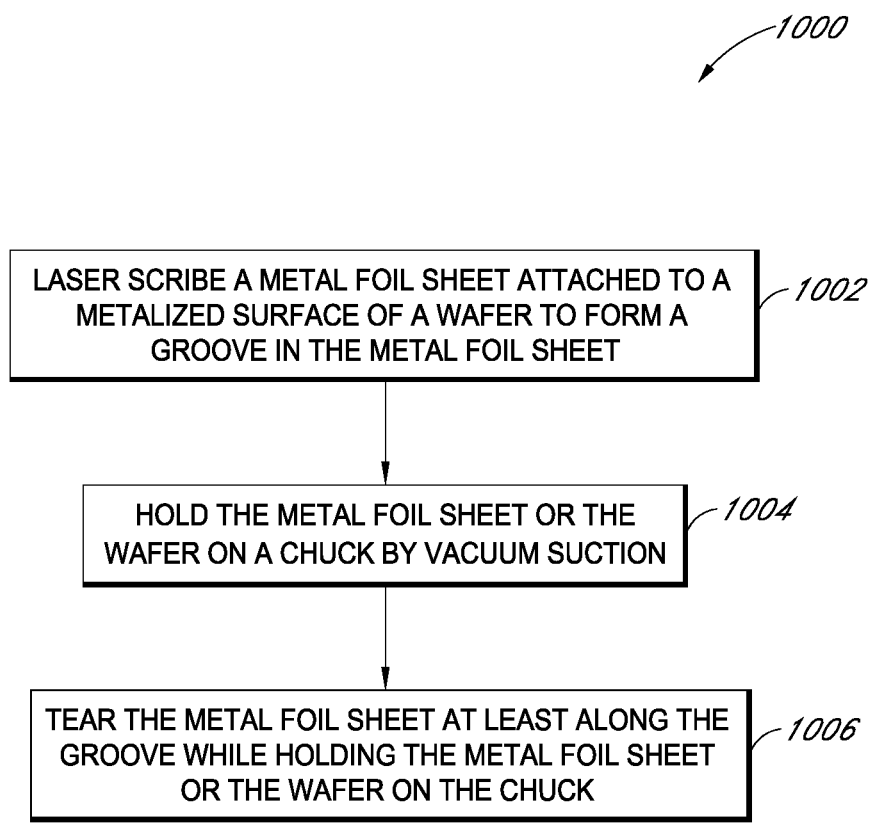
FIG. 10 is a flowchart listing operations in a general method of fabricating a solar cell, in accordance with an embodiment of the present disclosure.

Perhaps more generally, referring to both approaches described above, FIG. 10 is a flowchart 1000 listing operations in a method of fabricating a solar cell, in accordance with an embodiment of the present disclosure.

Referring to operation 1002 of flowchart 1000, a method of fabricating a solar cell involves laser scribing a metal foil sheet 102 attached to a metallized surface 106 of a wafer 104 to form a groove in the metal foil sheet 102. At operation 1004, subsequent to the laser scribing, the method further involves holding the metal foil sheet 102 or the wafer on a chuck 300 by vacuum suction. At operation 1006, while holding the metal foil sheet 102 or the wafer 104 on the chuck 300, the method further involves tearing the metal foil sheet 102 at least along the groove to trim the metal foil sheet 102 and to leave remaining a metal foil piece 102' electrically connected to the metallized surface 106 of the wafer 104. In one embodiment, the metal foil sheet 102 of the metal foil sheet 102 and wafer 104 pairing is held on the chuck 300, as described in association with FIGS. 1, 2A-2E and 3-7. In another embodiment, the wafer 104 of the metal foil sheet 102 and wafer 104 pairing is held on the chuck 300, as described in association with FIGS. 9A-9E.

In another aspect, new solar cell architectures are achievable using one or more of the above described foil trim approaches. In a first example, FIG. 11 illustrates plan and cross-sectional views of a solar cell having foil-based metallization, in accordance with an embodiment of the present disclosure.

Figure 11:
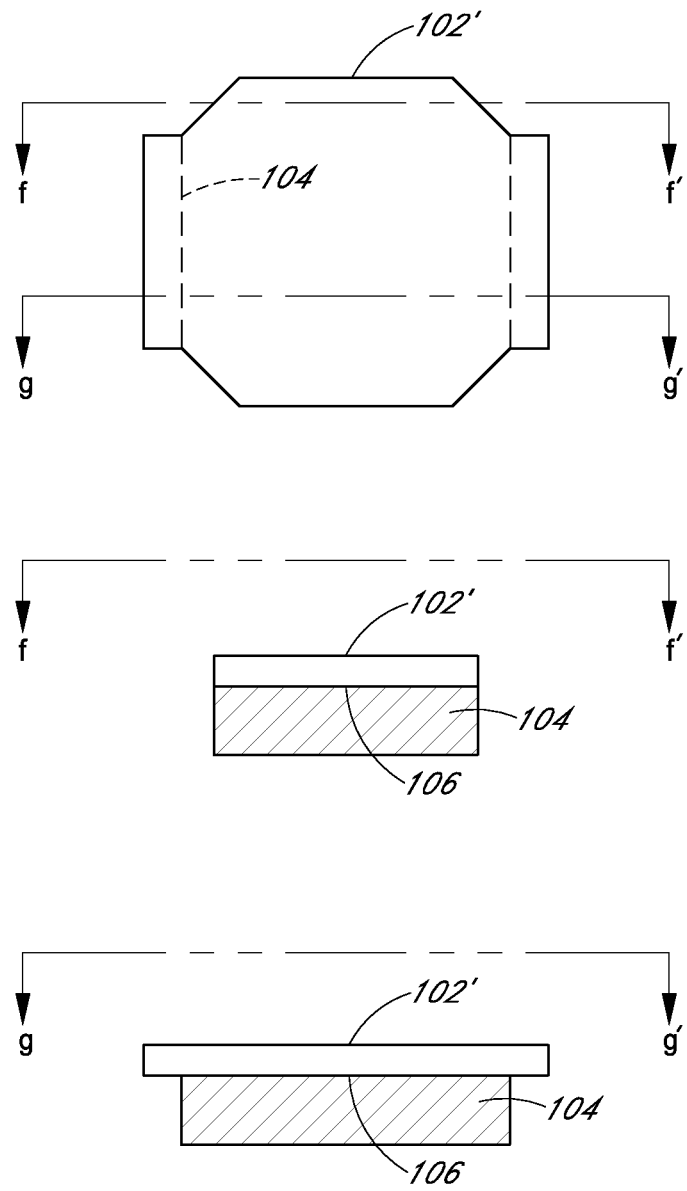
FIG. 11 illustrates plan and cross-sectional views of a solar cell having foil-based metallization, in accordance with an embodiment of the present disclosure.

Referring to FIG. 11, a solar cell is formed based on a metal foil process and laser grooving described in association with FIG. 2D. In particular, a remaining metal foil piece 102' is electrically connected to an underlying wafer 104 (a portion of the perimeter of which is shown by the dashed lines in the plan view of FIG. 11). The metal foil piece 102' has a perimeter with a first portion in alignment with a first portion of the perimeter of the wafer 104 (as seen in the cross-sectional view taken along the f-f' axis). The perimeter of the metal foil piece 102' also has a second portion overhanging a second portion of the perimeter of the wafer 104 (as seen in the cross-sectional view taken along the g-g' axis).

Figure 12:
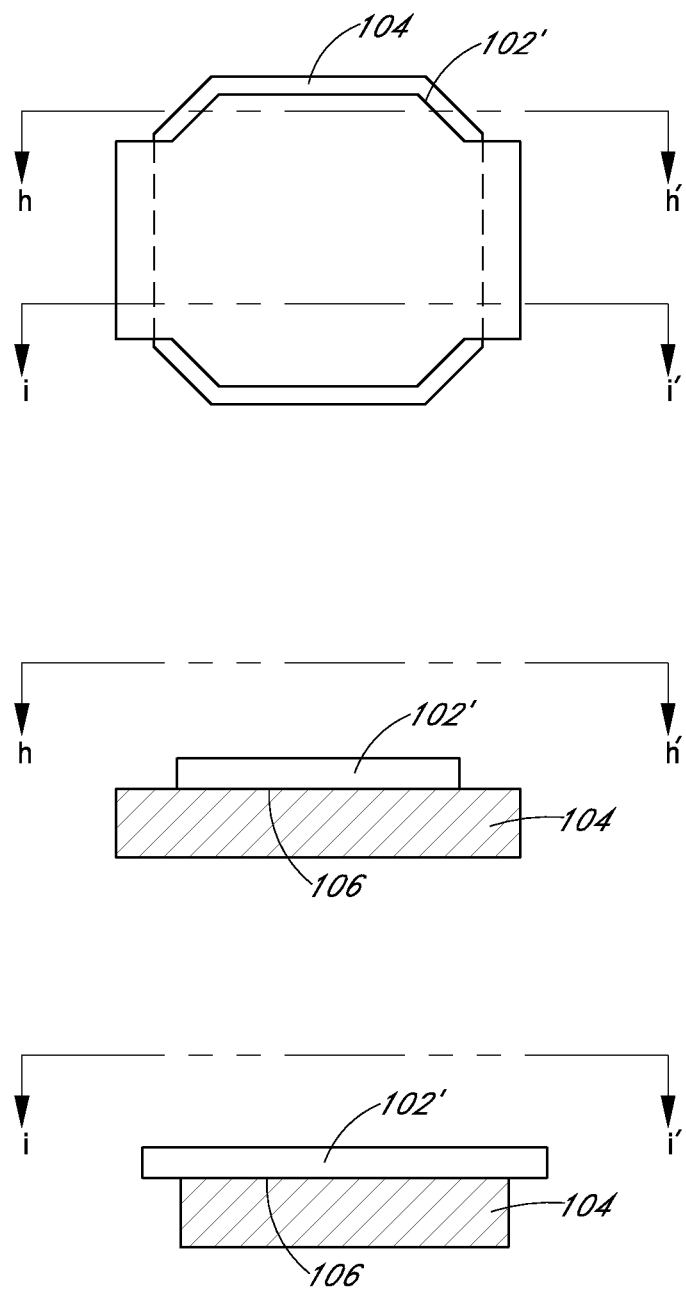
FIG. 12 illustrates plan and cross-sectional views of another solar cell having foil-based metallization, in accordance with another embodiment of the present disclosure.

In a second example, FIG. 12 illustrates plan and cross-sectional views of another solar cell having foil-based metallization, in accordance with another embodiment of the present disclosure.

Referring to FIG. 12, a solar cell is formed based on a metal foil process and laser grooving described in association with FIG. 2E. In particular, a remaining metal foil piece 102' is electrically connected to an underlying wafer 104 (a portion of the perimeter of which is shown by the dashed lines, and a portion of which is shown in solid lines, in the plan view of FIG. 12). The metal foil piece 102' has a perimeter with a first portion within a first portion of the perimeter of the wafer 104 (as seen in the cross-sectional view taken along the h-h' axis). The perimeter of the metal foil piece 102' also has a second portion overhanging a second portion of the perimeter of the wafer 104 (as seen in the cross-sectional view taken along the i-i' axis).

As described briefly above, initial patterning of the metal foil in contact with emitter regions of a solar cell may be performed during the lasing operation implemented for foil trim. As an example, FIGS. 13A and 13B illustrate cross-sectional views of various stages in the fabrication of a solar cell using foil-based metallization, in accordance with another embodiment of the present disclosure.

Referring to FIG. 13A, a plurality of alternating N-type and P-type semiconductor regions are formed above a substrate. In particular, a substrate 1300 has disposed there above N-type semiconductor regions 1304 and P-type semiconductor regions 1306 disposed on a thin dielectric material 1302 as an intervening material between the N-type semiconductor regions 1304 or P-type semiconductor regions 1306, respectively, and the substrate 1300. The substrate 1300 has a light-receiving surface 1301 opposite a back surface above which the N-type semiconductor regions 1304 and P-type semiconductor regions 1306 are formed.

In an embodiment, the substrate 1300 is a monocrystalline silicon substrate, such as a bulk single crystalline N-type doped silicon substrate. It is to be appreciated, however, that substrate 1300 may be a layer, such as a multi-crystalline silicon layer, disposed on a global solar cell substrate. In an embodiment, the thin dielectric layer 1302 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 1304 and 1306, respectively, are formed from polycrystalline silicon formed by, e.g., using a plasma-enhanced chemical vapor deposition (PECVD) process. In one such embodiment, the N-type polycrystalline silicon emitter regions 1304 are doped with an N-type impurity, such as phosphorus. The P-type polycrystalline silicon emitter regions 1306 are doped with a P-type impurity, such as boron. As is depicted in FIG. 13A, the alternating N-type and P-type semiconductor regions 1304 and 1306 may have trenches 1308 formed there between, the trenches 1308 extending partially into the substrate 1300. Additionally, in one embodiment, a bottom anti-reflective coating (BARC) material 1310 or other protective layer (such as a layer amorphous silicon) is formed on the alternating N-type and P-type semiconductor regions 1304 and 1306, as is depicted in FIG. 13A.

In an embodiment, the light receiving surface 1301 is a texturized light-receiving surface, as is depicted in FIG. 13A. In one embodiment, a hydroxide-based wet etchant is employed to texturize the light receiving surface 1301 of the substrate 1300 and, possibly, the trench 1308 surfaces as is also depicted in FIG. 13A. It is to be appreciated that the timing of the texturizing of the light receiving surface may vary. For example, the texturizing may be performed before or after the formation of the thin dielectric layer 3102. In an embodiment, a texturized surface may be one which has a regular or an irregular shaped surface for scattering incoming light, decreasing the amount of light reflected off of the light receiving surface 1301 of the solar cell. Referring again to FIG. 13A, additional embodiments can include formation of a passivation and/or anti-reflective coating (ARC) layers (shown collectively as layer 1312) on the light-receiving surface 1301. It is to be appreciated that the timing of the formation of passivation and/or ARC layers may also vary.

Referring again to FIG. 13A, a plurality of metal seed material regions 1314 is formed to provide a metal seed material region on each of the alternating N-type and P-type semiconductor regions 1304 and 1306, respectively. The metal seed material regions 1314 make direct contact to the alternating N-type and P-type semiconductor regions 1304 and 1306. In an embodiment, the metal seed regions 1314 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 1314 include a metal such as, but not limited to, nickel, silver, cobalt or tungsten. Optionally, a protection layer may be included on the plurality of metal seed material regions 1314. In a particular embodiment, an insulating layer 1316 is formed on the plurality of metal seed material regions 1314. In an embodiment, the insulating layer 1316 is a silicon nitride or silicon oxynitride material layer. In another embodiment, in place of the metal seed regions 1314, a blanket metal seed layer is used that is not patterned at this stage of processing. In that embodiment, the blanket metal seed layer may be patterned in a subsequent etching process, such as a hydroxide-based wet etching process.

Referring again to FIG. 13A, a metal foil 1318 is adhered to the alternating N-type and P-type semiconductor regions by directly coupling portions of the metal foil 1318 with a corresponding portion of each of the metal seed material regions 1314. In one such embodiment, the direct coupling of portions of the metal foil 1318 with a corresponding portion of each of the metal seed material regions 1314 involves forming a metal weld 1320 at each of such locations, as is depicted in FIG. 13A.

In an embodiment, the metal foil 1318 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), 0-grade (full soft), H-grade (strain hardened) or T-grade (heat treated). In one embodiment, the aluminum foil is an anodized aluminum foil. In an embodiment, the metal foil 1318 is adhered directly to the plurality of metal seed material regions 1314 by using a technique such as, but not limited to, a laser welding process, a thermal compression process or an ultrasonic bonding process. In an embodiment, the optional insulating layer 1316 is included, and adhering the metal foil 1318 to the plurality of metal seed material regions 1314 involves breaking through regions of the insulating layer 1316, as is depicted in FIG. 13A.

It is to be appreciated that, in accordance with another embodiment of the present disclosure, a seedless approach may be implemented. In such an approach, metal seed material regions 1314 are not formed, and the metal foil 1318 is adhered directly to the material of the alternating N-type and P-type semiconductor regions 1304 and 1306. For example, in one embodiment, the metal foil 1318 is adhered directly to alternating N-type and P-type polycrystalline silicon regions.

FIG. 13B illustrates the structure of FIG. 13A following formation of laser grooves in the metal foil. Referring to FIG. 13B, the metal foil 1318 is laser ablated through only a portion of the metal foil 1318 at regions corresponding to locations between the alternating N-type and P-type semiconductor regions 1304 and 1306, e.g., above trench 1308 locations as is depicted in FIG. 13B. The laser ablating forms grooves 1330 that extend partially into, but not entirely through, the metal foil 1318. In an embodiment, forming laser grooves 1330 involves laser ablating a thickness of the metal foil 1318 approximately in the range of 80-99% of an entire thickness of the metal foil 1318. That is, in one embodiment, it is critical that the lower portion of the metal foil 1318 is not penetrated, such that metal foil 1318 protects the underlying emitter structures.

In an embodiment, the structure of FIG. 13B may also be subjected to a metal foil trim process, such as one of the processes described above. In one such embodiment, initial laser grooving for one of the above described foil trim approaches is performed in a same laser process used to perform the laser grooving to form grooves 1330. Following foil trim, the grooves 1330 of FIG. 13B may then be used to isolate conductive regions 1340 as metallization structure for the underlying emitter regions.

In a first exemplary embodiment, following a foil trim process, the remaining metal foil 1318 is subsequently anodized at exposed surfaces thereof to isolate regions 1340 of the remaining metal foil 1318 corresponding to the alternating N-type and P-type semiconductor regions 1304 and 1306. In particular, the exposed surfaces of the metal foil 1318, including the surfaces of the grooves 1330, are anodized to form an oxide coating. At locations corresponding to the alternating N-type and P-type semiconductor regions 1304 and 1306, e.g., in the grooves 1330 at locations above the trenches 1308, the entire remaining thickness of the metal foil 1318 is anodized there through to isolate regions 1340 of metal foil 1318 remaining above each of the N-type and P-type semiconductor regions 1304 and 1306.

In a second exemplary embodiment, following a foil trim process, instead of anodizing the metal foil 1318 to isolate portions of the metal foil 1318, the patterned metal foil 1318 is etched to isolate portions 1340 of the metal foil 1318. In one such embodiment, the structure of FIG. 13B (as remaining following a foil trim process) is exposed to a wet etchant. Although the wet etchant etches all exposed portions of the metal foil 1318, a carefully timed etch process is used to break through the bottoms of the laser grooves 1330 without significantly reducing the thickness of the non-grooved regions 1340 of the metal foil 1318. In a particular embodiment, a hydroxide based etchant is used, such as, but not limited to, potassium hydroxide (KOH) or tetramethylammonium hydroxide (TMAH). In either of the first or the second above described embodiments, the break through process of the laser grooves forms breaks in the metal foil piece that remains attached to the underlying wafer.

Coupling of a metal foil with underlying emitter regions of a solar cell (or metal seed regions on the emitter regions) need not require direct coupling of all contact points of the metal foil and the solar cell. As an example, FIGS. 14A and 14B illustrate angled views of various stages in the fabrication of a solar cell using foil-based metallization, in accordance with another embodiment of the present disclosure.

Figure 14A:
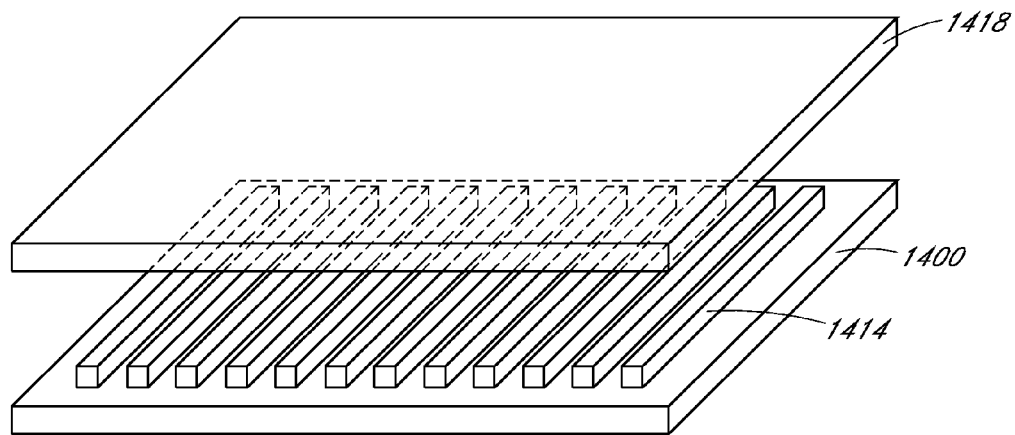
FIGS. 14A and 14B illustrate angled views of various stages in the fabrication of a solar cell using foil-based metallization, in accordance with another embodiment of the present disclosure.
Figure 14B:
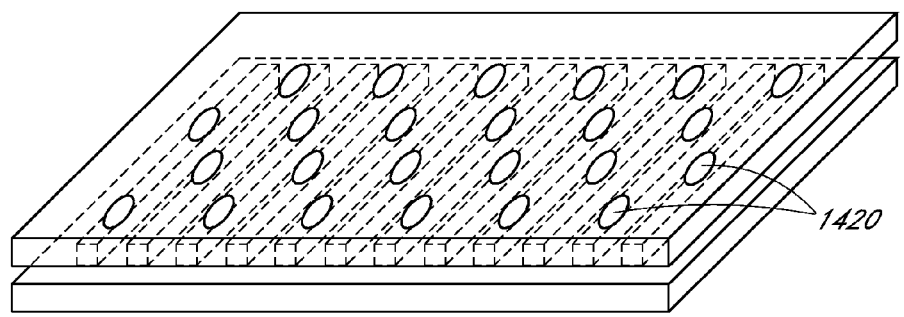

Referring to FIG. 14A, a metal foil 1418 is fit-up with a wafer 1400 having a plurality of emitter regions 1414 (which may include metal seed regions) disposed thereon. Referring to FIG. 14B, laser welding is performed in only certain location in order to generate weld spots 1420 adhering the foil 1418 to the plurality of emitter regions 1414. The structure of FIG. 14B may then be subjected to a metal foil trim process, such as one of the processes described above. Furthermore, the structure of FIG. 14B may also be subjected to a contact metallization patterning process, such as the process described in association with FIGS. 13A and 13B.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, foil trim approaches for foil-based metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
  attaching a metal foil sheet to a metallized surface of an underlying supported wafer to provide a unified pairing of the metal foil sheet and the wafer;
  subsequent to attaching the metal foil sheet, laser scribing a portion of the metal foil sheet from above to form a groove in the metal foil sheet;
  subsequent to laser scribing the metal foil sheet, rotating the unified pairing of the metal foil sheet and the wafer to provide the metal sheet below the wafer;
  subsequent to the rotating, placing the unified pairing of the metal foil sheet and the wafer on a chuck with the metal sheet below the wafer; and
  tearing the metal foil sheet at least along the groove to trim the metal foil sheet and to leave remaining a metal foil piece electrically connected to the metallized surface of the wafer.

2. The method of claim 1, wherein placing the unified pairing of the metal foil sheet and the wafer on the chuck comprises further comprises holding the unified pairing on the chuck by vacuum suction or by clamping.

3. The method of claim 1, wherein the wafer has a perimeter, and wherein laser scribing the portion of the metal foil sheet forms the groove in alignment with or within a portion of the perimeter of the wafer.

4. The method of claim 3, wherein laser scribing the portion of the metal foil sheet further forms a second groove outside of a portion of the perimeter of the wafer.

5. The method of claim 4, further comprising:
  further laser scribing the second groove to form a cut in a portion of the metal foil sheet.

6. The method of claim 4, further comprising:
  subsequent to rotating the unified pairing of the metal foil sheet and the wafer and prior to tearing the metal foil sheet, laser scribing the metal foil sheet in alignment with the second groove to form a complementary groove in the metal foil sheet.

7. The method of claim 1, wherein the wafer has a perimeter, and wherein laser scribing the portion of the metal foil sheet forms the groove outside of a portion of the perimeter of the wafer.

8. The method of claim 7, further comprising:
  further laser scribing the groove to form a cut in a portion of the metal foil sheet.

9. The method of claim 7, further comprising:
  subsequent to rotating the unified pairing of the metal foil sheet and the wafer and prior to tearing the metal foil sheet, laser scribing the metal foil sheet in alignment with the groove to form a complementary groove in the metal foil sheet.

* * * * *